(12) United States Patent
Sawada

(10) Patent No.: US 12,120,834 B2
(45) Date of Patent: Oct. 15, 2024

(54) LOCKING ASSEMBLY FOR VEHICLE FUSE BOX

(71) Applicant: Nissan North America, Inc., Franklin, TN (US)

(72) Inventor: Ryo Sawada, Yokohama (JP)

(73) Assignee: Nissan North America, Inc., Franklin, TN (US)

( * ) Notice: Subject to any disclaimer, the term of this patent is extended or adjusted under 35 U.S.C. 154(b) by 439 days.

(21) Appl. No.: 17/427,892

(22) PCT Filed: Feb. 20, 2019

(86) PCT No.: PCT/US2019/018670
§ 371 (c)(1),
(2) Date: Aug. 2, 2021

(87) PCT Pub. No.: WO2020/171804
PCT Pub. Date: Aug. 27, 2020

(65) Prior Publication Data
US 2022/0053658 A1    Feb. 17, 2022

(51) Int. Cl.
| | |
|---|---|
| *H02G 3/14* | (2006.01) |
| *B60R 16/02* | (2006.01) |
| *H01H 85/20* | (2006.01) |
| *H05K 5/02* | (2006.01) |
| *H05K 5/03* | (2006.01) |

(52) U.S. Cl.
CPC ............ *H05K 5/0221* (2013.01); *B60R 16/02* (2013.01); *H01H 85/20* (2013.01); *H02G 3/14* (2013.01); *H05K 5/03* (2013.01); *H01H 2085/208* (2013.01)

(58) Field of Classification Search
CPC ...... H02G 3/14; B65D 43/163; B65D 43/164; B65D 43/165
USPC ................................................. 220/810, 845
See application file for complete search history.

(56) References Cited

U.S. PATENT DOCUMENTS

| | | | |
|---|---|---|---|
| 8,785,775 B2 | 7/2014 | Takeuchi et al. | |
| 9,120,595 B2 * | 9/2015 | Chou | ................... B65D 43/162 |
| 10,738,935 B2 * | 8/2020 | Hsu | ................... H01L 21/67386 |

FOREIGN PATENT DOCUMENTS

| | | |
|---|---|---|
| GB | 2442584 A | 4/2008 |
| JP | 3709960 B2 | 10/2005 |

OTHER PUBLICATIONS

International Search Report in PCT/US2019/018670 dated Apr. 24, 2019.
Written Opinion, mailed on Apr. 24, 2019.

* cited by examiner

*Primary Examiner* — Stephen J Castellano
(74) *Attorney, Agent, or Firm* — Global IP Counselors, LLP

(57) ABSTRACT

A locking assembly for a fuse box of a vehicle includes a base and a cover configured to be removably connected to the base. The base includes a projection extending outwardly from the base. An opening is disposed in the projection. The cover includes a locking member configured to be received by the opening in the projection when the cover is connected to the base. The cover is configured to rotate about a pivot axis of the locking member to disengage the locking member from the opening in the projection to remove the cover from the base.

19 Claims, 12 Drawing Sheets

LOCKING ASSEMBLY FOR VEHICLE FUSE BOX

BACKGROUND

Field of the Invention

The present invention generally relates to a fuse box assembly for a vehicle. More specifically, the present invention relates to a locking assembly for a fuse box of a vehicle.

Background Information

A fuse box receives electrical wiring, which is connected to fuses disposed in the fuse box. The electrical wiring is conventionally bundled in a wiring conduit that is routed to the fuse box. The wiring conduit terminates inside the fuse box such that the electrical wires can be connected to the appropriate fuses. Forces acting on the wiring conduits or electrical wires can cause movement of a wiring conduit or electrical wire within the fuse box. This movement can result in a force acting on a cover of the fuse box, thereby separating the fuse box cover from a base of the fuse box. Accordingly, a need exists for a locking assembly for a fuse box of a vehicle to substantially prevent separation of the fuse box cover from the fuse box base.

SUMMARY

An object of the disclosure is to provide a locking assembly for a fuse box of a vehicle.

In view of the state of the known technology, one aspect of the present disclosure is to provide a locking assembly for a fuse box of a vehicle including a base and a cover configured to be removably connected to the base. The base includes a projection extending outwardly from the base. An opening is disposed in the projection. The cover includes a locking member configured to be received by the opening in the projection when the cover is connected to the base. The cover is configured to rotate about a pivot axis of the locking member to disengage the locking member from the opening in the projection to remove the cover from the base.

Another aspect of the present invention includes a fuse box assembly for a vehicle including a fuse box base and a fuse box cover movably connected to the fuse box base. The fuse box cover is movable between a first position and a second position. The fuse box cover is connected to the fuse box base in the first position and removable from the fuse box base in the second position. A projection extends outwardly from the fuse box base. An opening is disposed in the projection. A locking member is received by the opening in the projection when the fuse box cover is in the first position and the locking member is removable from the opening in the projection when the fuse box cover is in the second position. The fuse box cover is configured to rotate about a pivot axis of the locking member to move between the first and second positions.

Also other objects, features, aspects and advantages of the locking assembly for a vehicle fuse box will become apparent to those skilled in the art from the following detailed description, which, taken in conjunction with the annexed drawings, discloses exemplary embodiments of the locking assembly.

BRIEF DESCRIPTION OF THE DRAWINGS

Referring now to the attached drawings which form a part of this original disclosure.

DETAILED DESCRIPTION OF EXEMPLARY EMBODIMENTS

Figure 1:
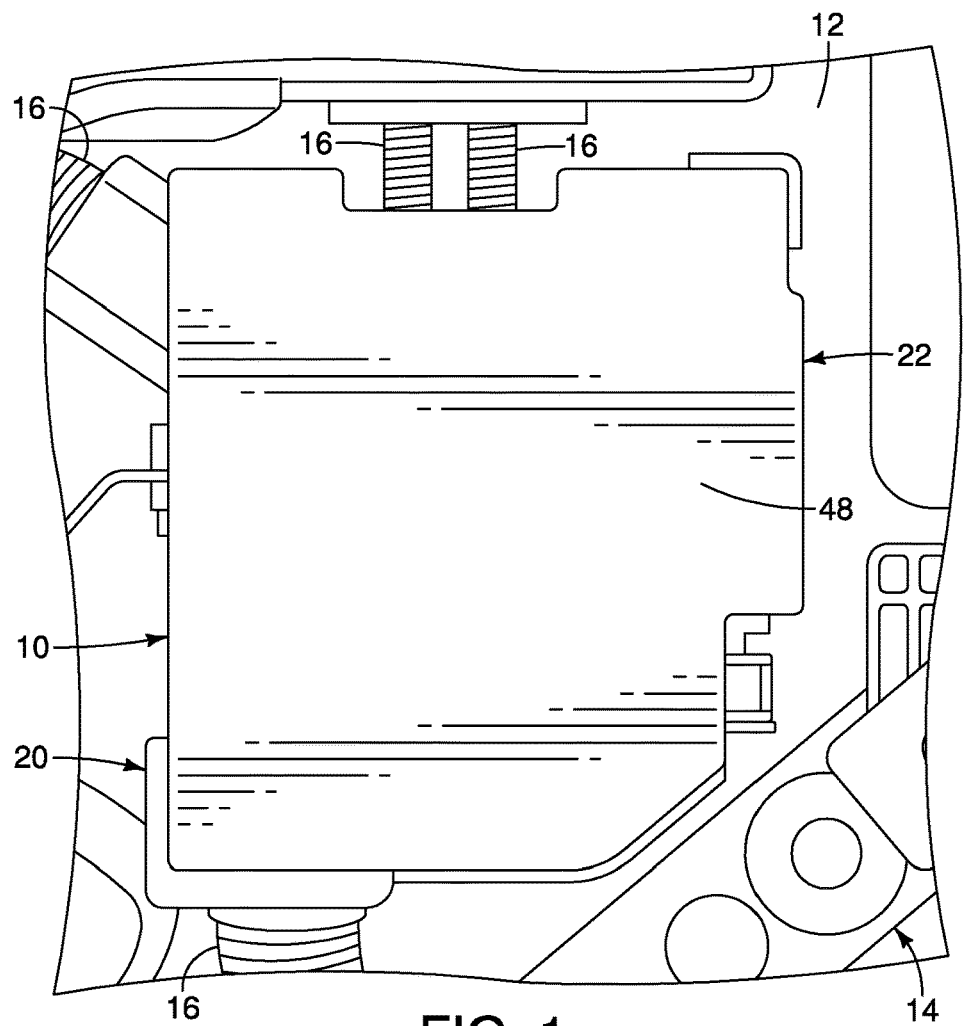
FIG. 1 is a perspective view of a fuse box assembly in accordance with an exemplary embodiment of the present invention disposed in an engine compartment of a vehicle.

Selected embodiments will now be explained with reference to the drawings. It will be apparent to those skilled in the art from this disclosure that the following descriptions of the exemplary embodiments are provided for illustration only and not for the purpose of limiting the invention as defined by the appended claims and their equivalents.

Referring initially to FIGS. 1-6, a fuse box assembly 10 is illustrated in accordance with an exemplary embodiment of the present invention. The fuse box assembly 10 is disposed in an engine compartment 12 of a vehicle 14. The fuse box assembly 10 receives a plurality of conduits 16 that route electrical wiring to an interior compartment 18 of the fuse box 10. The fuse box assembly 10 includes a fuse box base 20 and a fuse box cover 22 removably connected to the fuse box base 20 that define the interior of the fuse box assembly 10.

Figure 3:
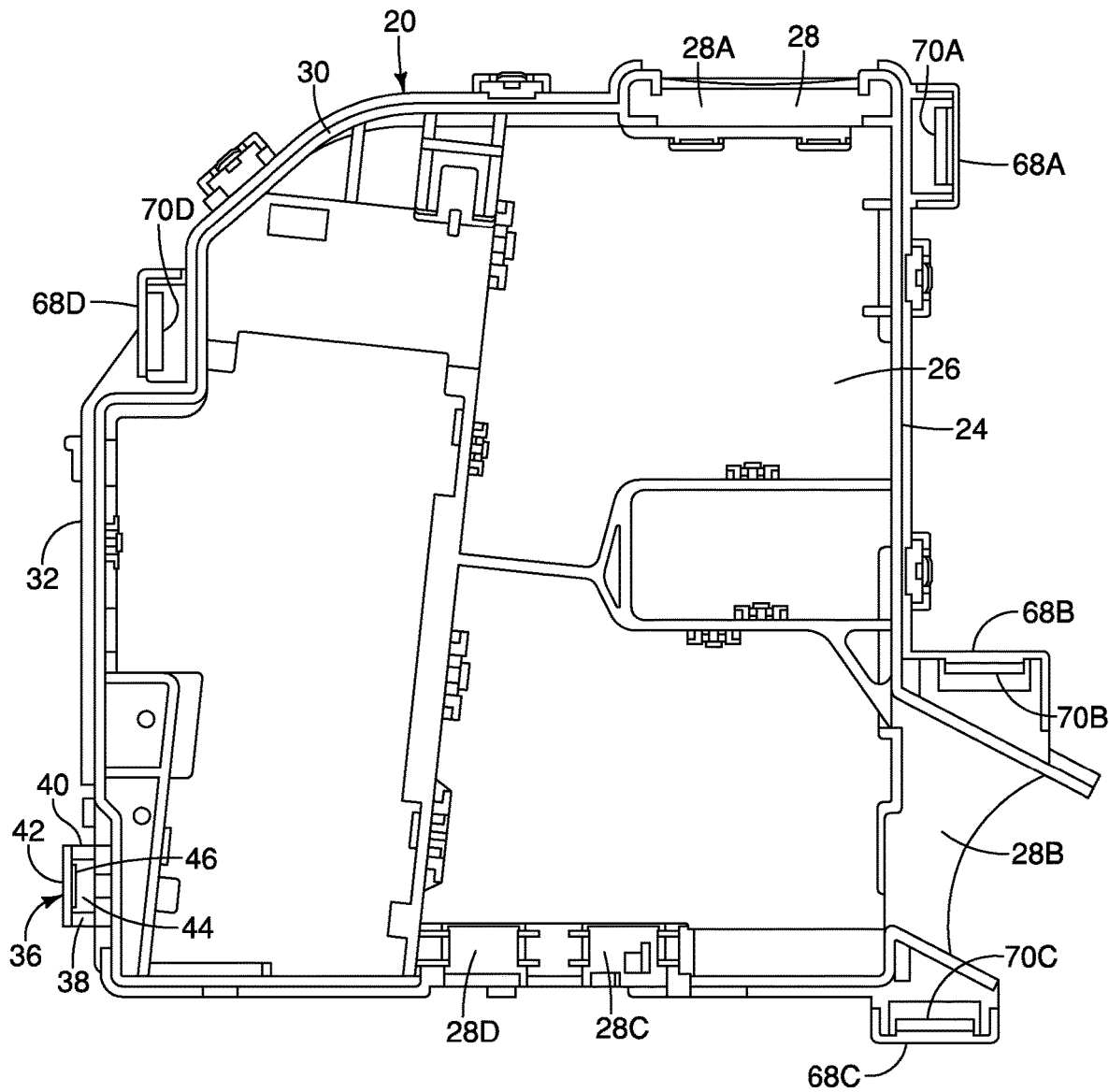
FIG. 3 is a perspective view of a fuse box base of the fuse box of FIG. 1.
Figure 7:
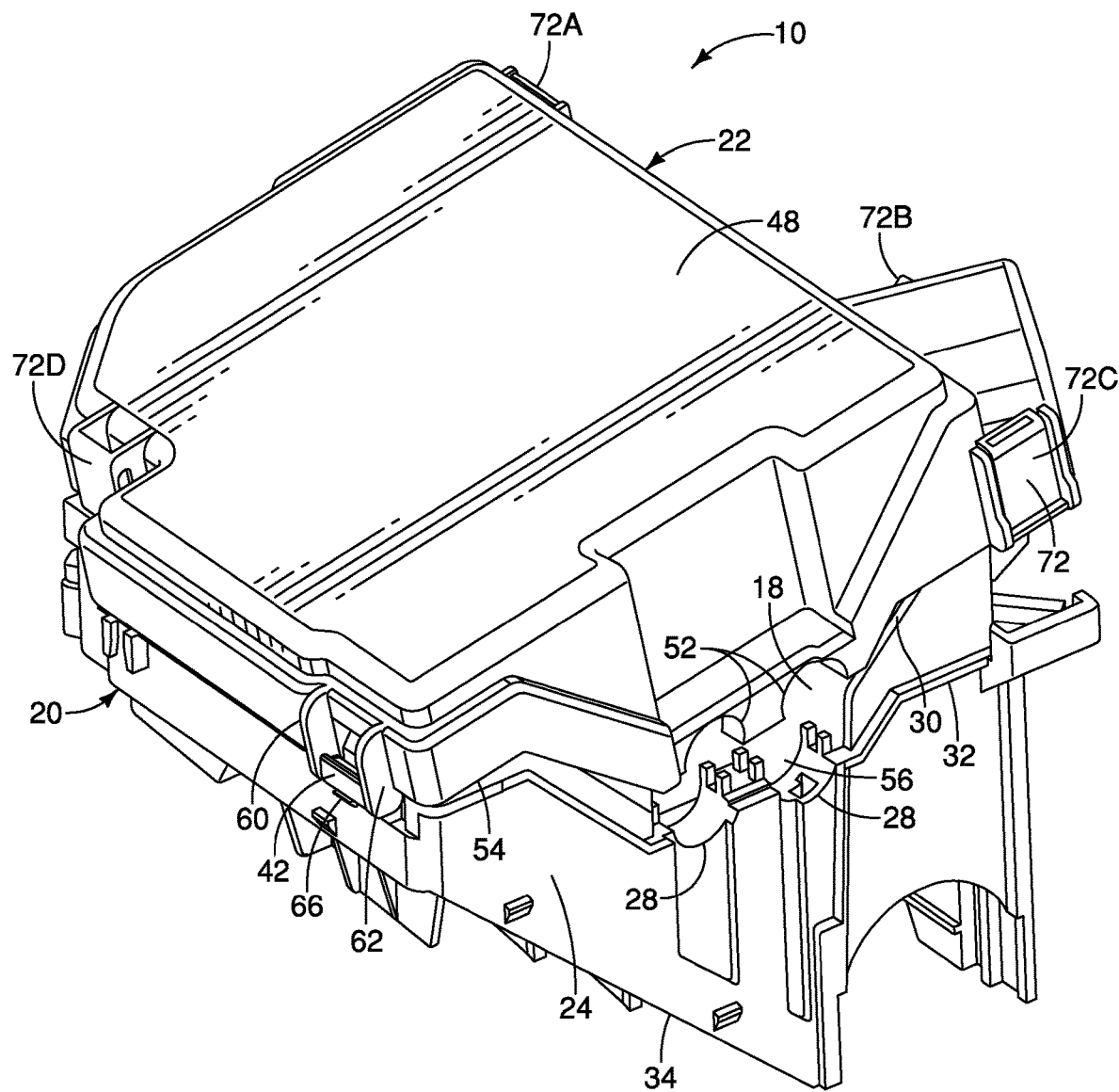
FIG. 7 is a perspective view of a fuse box assembly of FIG. 1 in which the fuse box cover is rotated approximately ten degrees from the closed position.

The fuse box base 20, as shown in FIG. 3, includes a lower wall 24 defining a lower interior portion 26 of the interior compartment 18. A plurality of interior walls further define separate compartments within the lower interior portion 26 of the interior compartment 18. A plurality of lower conduit receiving recesses 28 are formed in the lower wall 24. Preferably, the lower conduit receiving recesses 28 are formed in the upper end 30 of the lower wall 24. The base 20 is shown with four lower conduit receiving recesses 28A-28D, although the base 20 can be formed with any suitable number. A lip 32 extends outwardly from an outer surface of the lower wall 24. The lip is disposed on the outer surface of the lower wall 24 between the upper end 30 and a lower end 34 of the lower wall 24, as shown in FIG. 7. The lip 32 extends around a majority of a perimeter of the lower wall 24 except for the portions of the lower wall 24 in which the lower conduit receiving recesses 32 are disposed and in which a projection 36 is disposed. A lower base (not shown) is connected to the lower end 34 of the lower wall 24 to enclose the lower interior portion 26 of the interior compartment 18 when the lower base is connected to the fuse box base 20.

Figure 4:
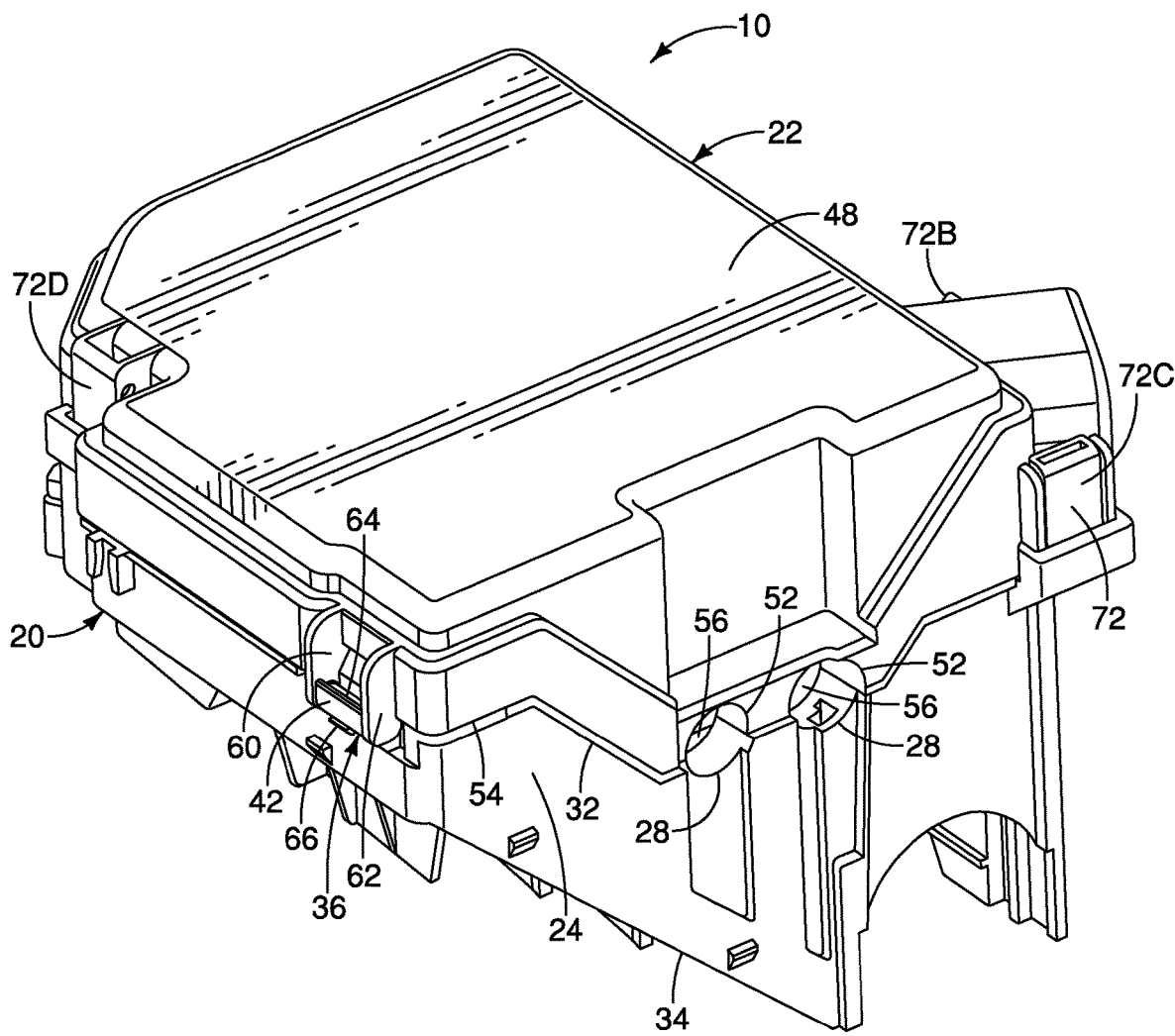
FIG. 4 is a perspective view of a fuse box assembly of FIG. 1 in which the fuse box cover is in a closed position.

A projection 36 extends outwardly from the fuse box base 20, as shown in FIGS. 3 and 4. The projection 36 includes first and second connecting arms 38 and 40 extending outwardly from the lower wall 24 of the base 20. An upwardly extending tab 42 extends upwardly from ends of the first and second connecting arms 38 and 40. The upwardly extending tab 42 is spaced from the lower wall 24 of the base 20. An opening 44 is disposed in the projection 36. The opening 44 is defined by the first and second connecting arms 38 and 40 and the upwardly extending tab 42. The opening 44 faces in a substantially downward direction. The projection 36 is preferably resiliently connected to the base 20.

Figure 6:
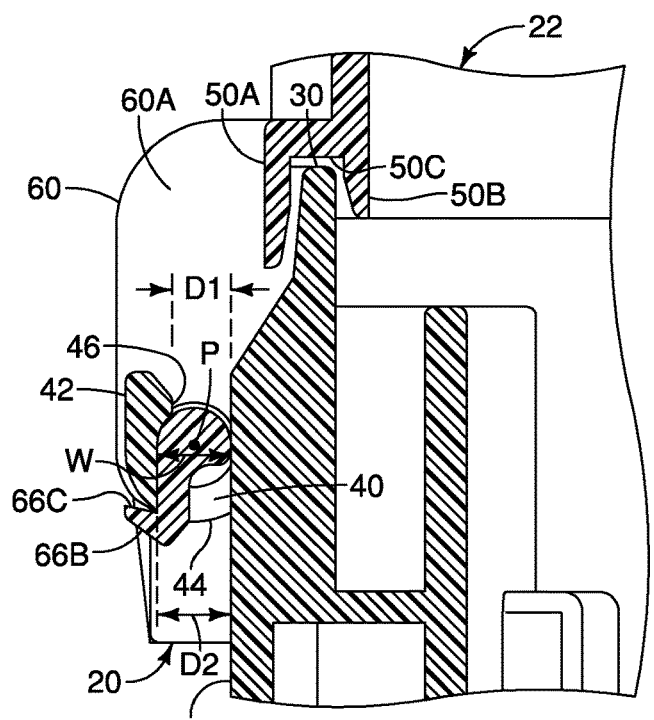
FIG. 6 is a side elevational view in cross section of the fuse box assembly of FIG. 4.

A protrusion 46 extends inwardly from an upper end of the tab 42, as shown in FIGS. 3 and 6. The protrusion 46 extends toward the lower wall 24 of the base 20. The protrusion 46 is preferably rounded, although the protrusion 46 can have any suitable shape. A gap D1 is defined between the protrusion 46 and the lower wall 24 of the base 20, as shown in FIG. 6. A gap D2 is defined between the inner surface of the tab 42 and the outer surface of the lower wall 24 of the base 20. The gap D1 is preferably smaller than the gap D2.

The fuse box cover 22 is configured to be removably connected to the base 20, as shown in FIGS. 7-18. The cover 22 includes an upper surface 48 configured to enclose an upper portion of the interior compartment 18 when the cover 22 is connected to the base 20 and disposed in a closed position, as shown in FIGS. 1 and 4. An upper wall 50 extends downwardly from the upper surface 48 of the cover 22. A plurality of upper conduit receiving recesses 52 are formed in the upper wall 50. Preferably, the upper conduit receiving recesses 52 are formed in the lower end 54 of the upper wall 50. The cover 22 has four upper conduit receiving recesses 52 corresponding to the four lower conduit receiving recesses 28. When the cover 22 is connected to the base 20 and disposed in the closed position, as shown in FIG. 4, each of the upper conduit receiving recesses 52 forms a conduit receiving aperture 56 with a corresponding lower conduit receiving recess 28.

Figure 2:
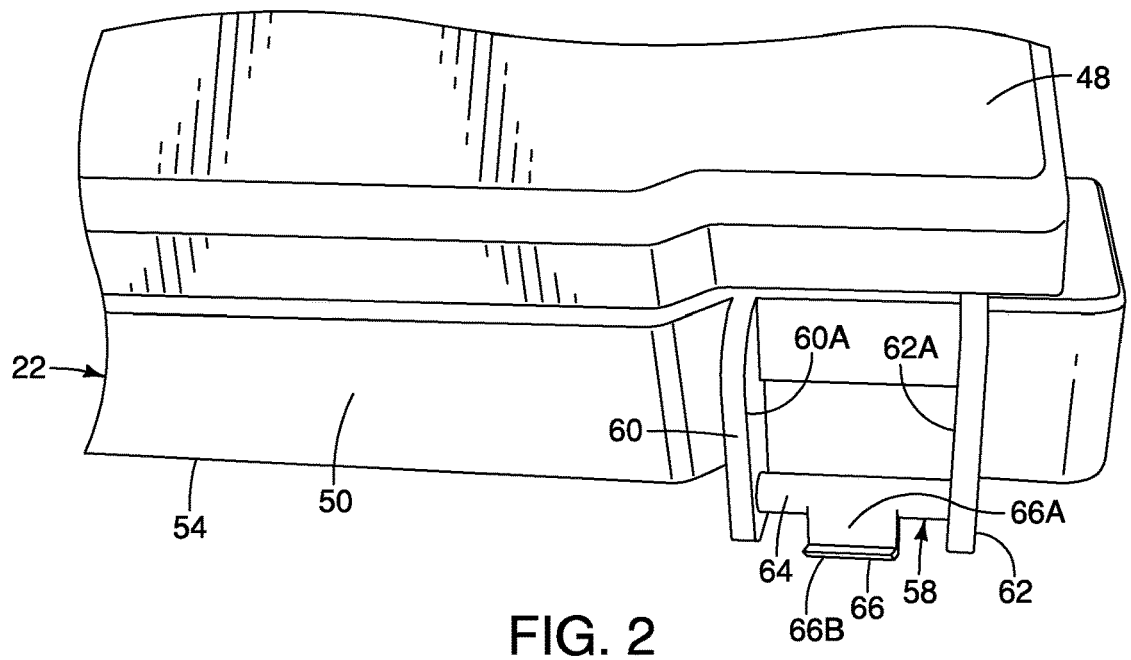
FIG. 2 is a perspective view of a fuse box cover of the fuse box assembly of FIG. 1.
Figure 5:
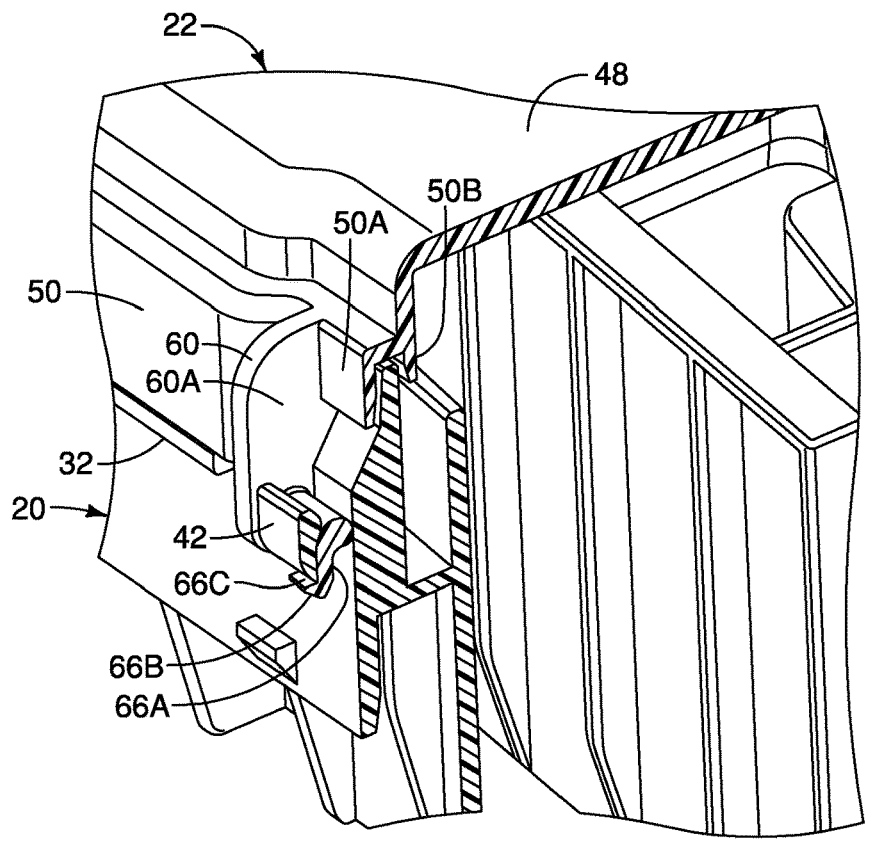
FIG. 5 is a perspective view in cross section of the fuse box assembly of FIG. 4.

The fuse box cover 22 includes a locking member 58, as shown in FIG. 2. The locking member 58 is configured to be received by the opening 44 in the projection 36 when the cover 22 is connected to the base 20, as shown in FIGS. 4-6. The cover 22 is configured to rotate about a pivot axis P of the locking member 58 to disengage the locking member 58 from the opening 44 in the projection 36 to remove the cover 22 from the base 20, as shown in FIGS. 4-18.

The locking member 58 includes a first locking tab 60 and a second locking tab 62, as shown in FIGS. 2 and 4. The first locking tab 60 extends outwardly from the upper wall 50, as shown in FIGS. 2 and 4. The second locking tab 62 extends outwardly from the upper wall 50. The second locking tab 62 is spaced from the first locking tab 60. The first locking tab 60 is preferably substantially parallel to the second locking tab 62.

The upper wall 50 includes an outer wall 50A and an inner wall 50B extending between the first and second locking tabs 60 and 62, as shown in FIGS. 5 and 6. The outer wall 50A extends downwardly longer than the inner wall 50B, as shown in FIG. 6. The outer wall 50A is spaced from the inner wall 50B in a direction substantially perpendicular to the pivot axis P direction to form a recess 50C therebetween. The recess 50C is configured to receive the upper end 30 of the lower wall 24 when the cover 22 is in the closed position.

The locking member 58 includes a locking post 64 extending between the first locking tab 60 and the second locking tab 62, as shown in FIGS. 2 and 4. The locking post 64 extends between an inner surface 60A of the first locking tab 60 and an inner surface 62A of the second locking tab 62. The pivot axis P passes through the locking post 64, as shown in FIGS. 6, 9, 12, 15 and 18.

The locking member 58 includes a locking hook 66 extending from the locking post 64, as shown in FIGS. 2 and 4. The locking hook 66 is preferably rigidly connected to the locking post 64, thereby substantially preventing movement of the locking hook 66 relative to the locking post 64. The locking hook 66 includes a first portion 66A extending downwardly from the locking post 64, and a second portion 66B extending outwardly from the first portion 66A. As shown in FIG. 6, the second portion 66B of the locking hook 66 extends forward of the upwardly extending tab 42. The locking member 58 is preferably unitarily formed with the cover 22 as a single-member.

As shown in FIGS. 4-6, the locking hook 66 engages the projection 36 when the cover 22 is connected to the base 20. The first portion 66A of the locking hook 66 extends through the opening 44 in the projection 36, and the second portion 66B of the locking hook 66 extends away from the outer surface of the lower wall 24 and beneath the upwardly extending tab 42. An upper surface 66C of the second portion 66B of the locking hook 66 engages the upwardly extending tab 42 to prevent upward movement of the cover 22, thereby preventing unintended or accidental separation of the cover 22 from the base 20. A length of upwardly extending tab 42 in the pivot axis P direction is less than a distance between the first and second locking tabs 60 and 62 in the pivot axis P direction, such that the locking post 64 is receivable by the projection 36.

The base 20 includes a plurality of cover receiving openings 68, as shown in FIG. 3. The plurality of cover receiving openings 68 are disposed on the outer surface of the lower wall 24. Each of the cover receiving openings 68 includes a projection 70 extending inwardly toward the outer surface of the lower wall 24. The base 20 is shown with four cover receiving openings 68A-68D, although any suitable number of cover receiving openings can be used. Each of the cover receiving openings 68A-68D has one projection 70A-70D extending inwardly toward the outer surface of the lower wall 24.

The cover 22 includes a plurality of locking tabs 72 extending therefrom that engage the corresponding plurality of cover receiving openings 68 of the base 20 to securely retain the cover 22 to the base 20 in the closed position. The cover 22 has an equivalent number of locking tabs 72 as the base 20 has cover receiving openings 68, such that the illustrated cover 22 has four locking tabs 72A-72D. Each of the locking tabs 72 engages one of the projections 70A-70D in the corresponding cover receiving opening 68A-68D when the cover 22 is in the closed position to substantially prevent movement of the cover 22 relative to the base 20. When the cover 22 is secured to the base 20, as shown in FIGS. 1 and 4-6, each of the plurality of locking tabs 72A-72D is received by one of the cover receiving openings 68A-68D and the locking member 58 engages the opening 44 in the projection 36 to securely retain the cover 22 to the base 20.

Figure 16:
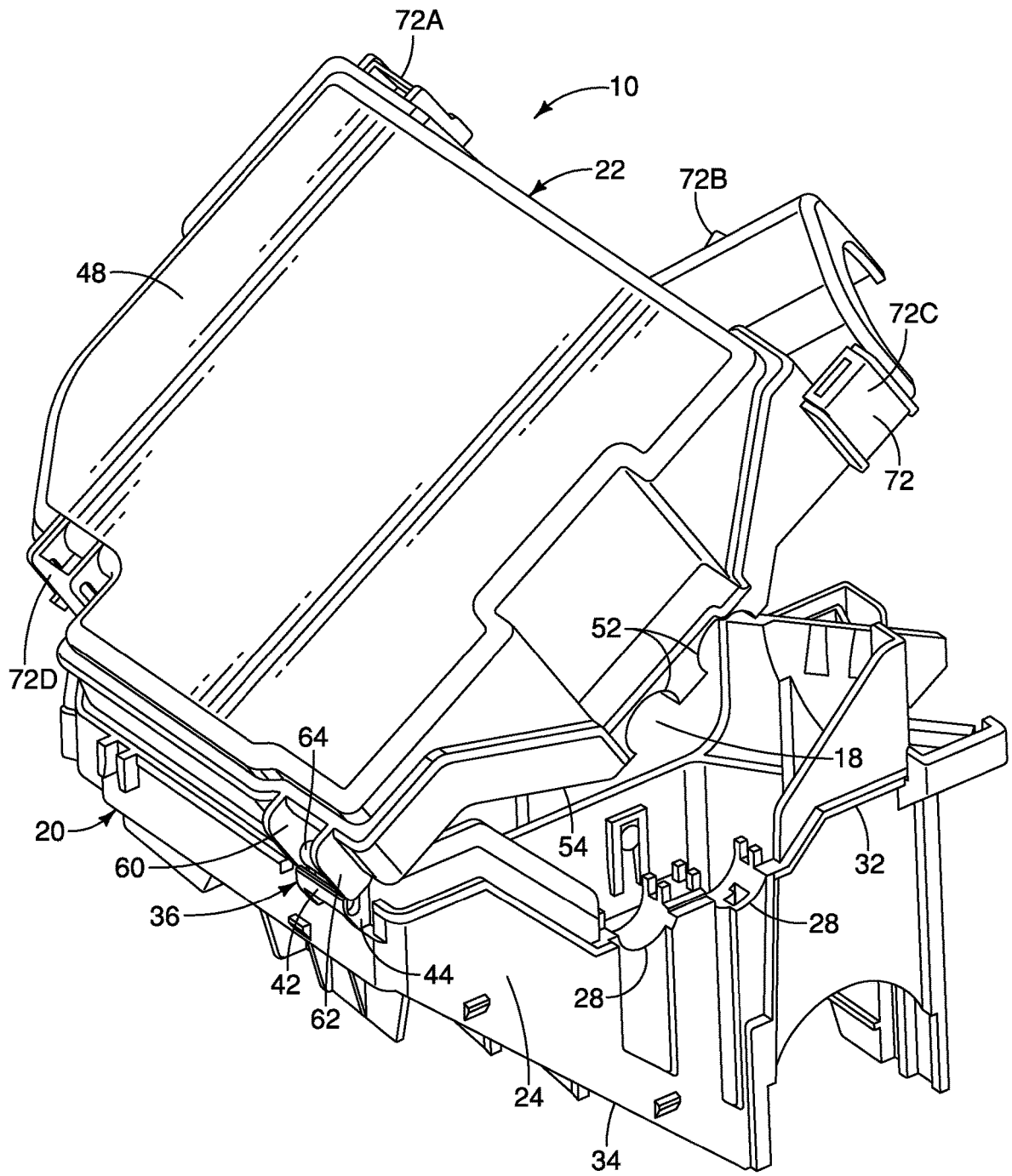
FIG. 16 is a perspective view of a fuse box assembly of FIG. 13 in which the fuse box cover is disengaged from the fuse box base such that the fuse box cover can be removed from the fuse box base.
Figure 17:
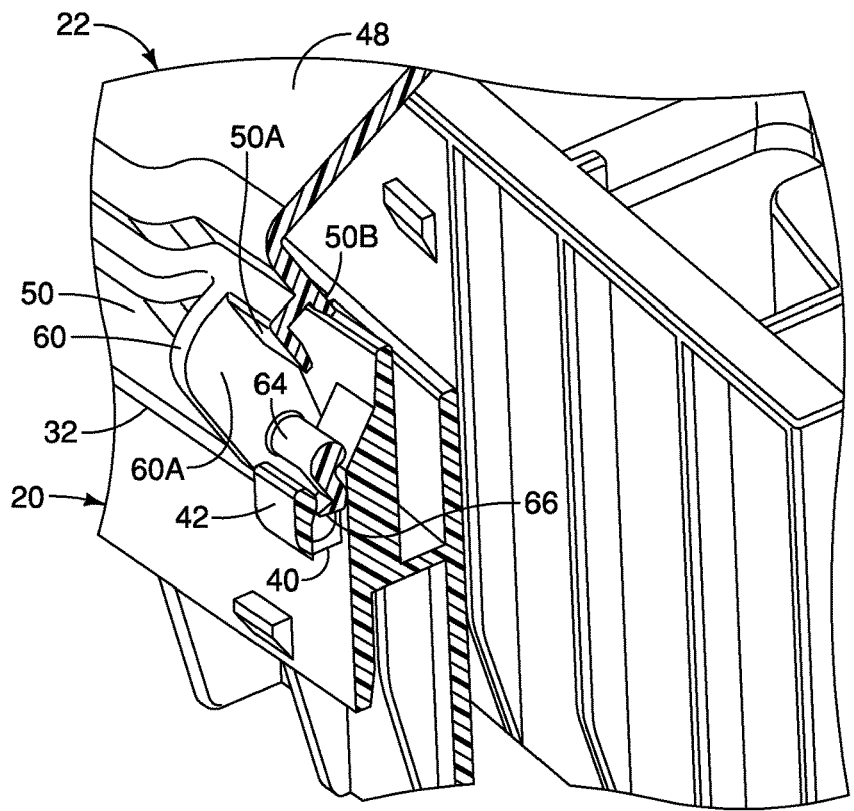
FIG. 17 is a perspective view in cross section of the fuse box assembly of FIG. 16.
Figure 18:
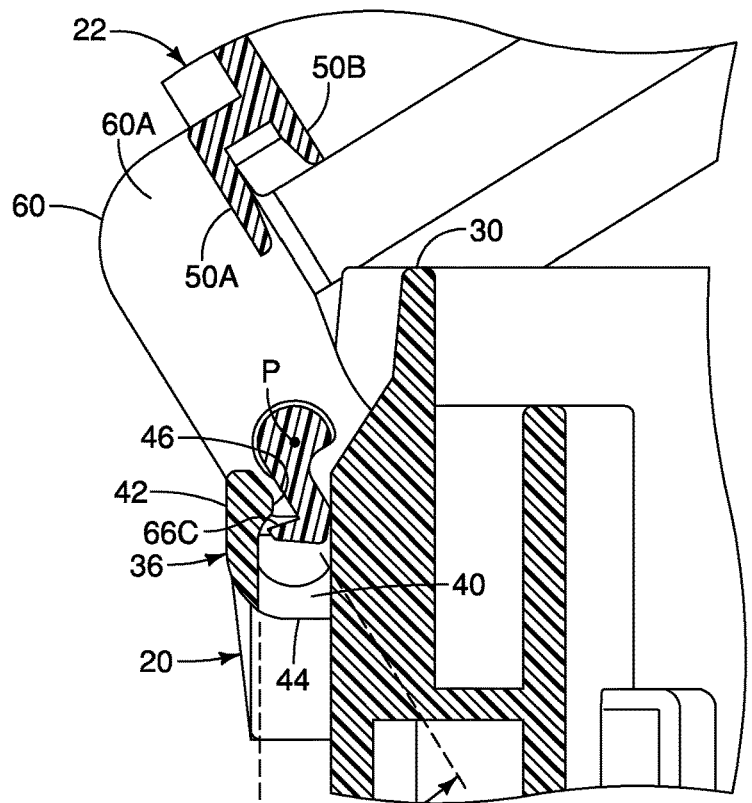
FIG. 18 is a side elevational view in cross section of the fuse box assembly of FIG. 16.

The cover 22 is movably connected to the base 20 between a first position, or the closed position, shown in FIGS. 1 and 4-6 and a second position, or opened position, shown in FIGS. 16-18. In the first position, the cover 22 is connected to the base 20 to substantially prevent movement of the cover 22 relative to the base 20. The locking member 58 is received by the opening 44 in the projection 36 when the cover 22 is in the first position. In the second position, the cover 22 is removable from the base 20. The locking member 58 is removable from the opening 44 in the projection 36 when the cover 22 is in the second position. The cover 22 is configured to rotate about the pivot axis P of the locking member 58 to move between the first and second positions. The locking post 64 is received by the first and second connecting arms 40 and 42 of the projection 36 and allows rotational movement of the locking post thereon, thereby allowing for rotational movement of the cover 22 relative to the base 18. The distance of the opening 44 between the outer surface of the lower wall 24 and the upwardly extending tab 42 in the direction substantially perpendicular to the pivot axis P allows for rotational movement of the locking hook 66 therethrough.

To remove the cover 22 from the base 20, each of the plurality of locking tabs 72A-72D is disengaged from the corresponding cover receiving opening 68A-68D and the locking member 58 is disengaged from the opening 44 in the projection 36. Once each of the locking tabs 72A-72D is disengaged from the corresponding cover receiving opening 68A-68D and the locking member 58 is disengaged from the opening 44 in the projection 36, the cover 22 can be removed from the base 20 providing access to the interior compartment 18 (FIG. 6).

Prior to disengaging the locking member 58 from the projection opening 44, each of the plurality of locking tabs 72A-72D is disengaged from the corresponding cover receiving opening 68A-68D. Prior to disengaging each of the plurality of locking tabs 72A-72D from the corresponding cover receiving openings 68A-68D, the fuse box cover 22 is prevented from pivoting about the pivot axis P of the locking member 58. The locking member 58 remains received by the opening 44 in the projection 36 when the plurality of locking tabs 72A-72D are disengaged from the corresponding cover receiving openings 68A-68D.

After each of the plurality of locking tabs 72A-72D is disengaged from the corresponding cover receiving openings 68A-68D, the cover 22 is rotatable about the pivot axis P with respect to the base 20, as shown in FIGS. 7-18. An angle α is defined between the locking member 58 and the projection 36, as shown in FIGS. 9, 12, 15 and 18. More specifically, the angle α is defined between the first portion 66A of the locking hook 66 of the locking member 58 and the upwardly extending tab 42 of the projection 36.

As shown in FIGS. 4-6, the cover 22 is in the closed position and is not rotated about the pivot axis P with respect to the base 20. In the closed position, the second portion 66B of the locking hook 66 is disposed beneath the upwardly extending tab 42, thereby preventing removal of the cover 22 from the base 20. A length of the upwardly extending tab 42 is less than a distance between the first and second 60 and 62 such that the locking member is received by the projection. A width W of the locking post 64 is larger than the gap D1 between the protrusion 46 and the outer surface of the lower wall 24 (i.e., the length of the gap D1 is smaller than a width W of the locking post 64), thereby further preventing upward movement of the cover 22 relative to the base 18. The lower end 54 of the upper wall 50 contacts the lip 32 on the outer surface of the lower wall 24 to facilitate positioning the cover 22 on the base 20. The upper end 30 of the lower wall 24 is received by the recess 50C between the outer wall 50A and the inner wall 50B of the cover 22.

Figure 8:
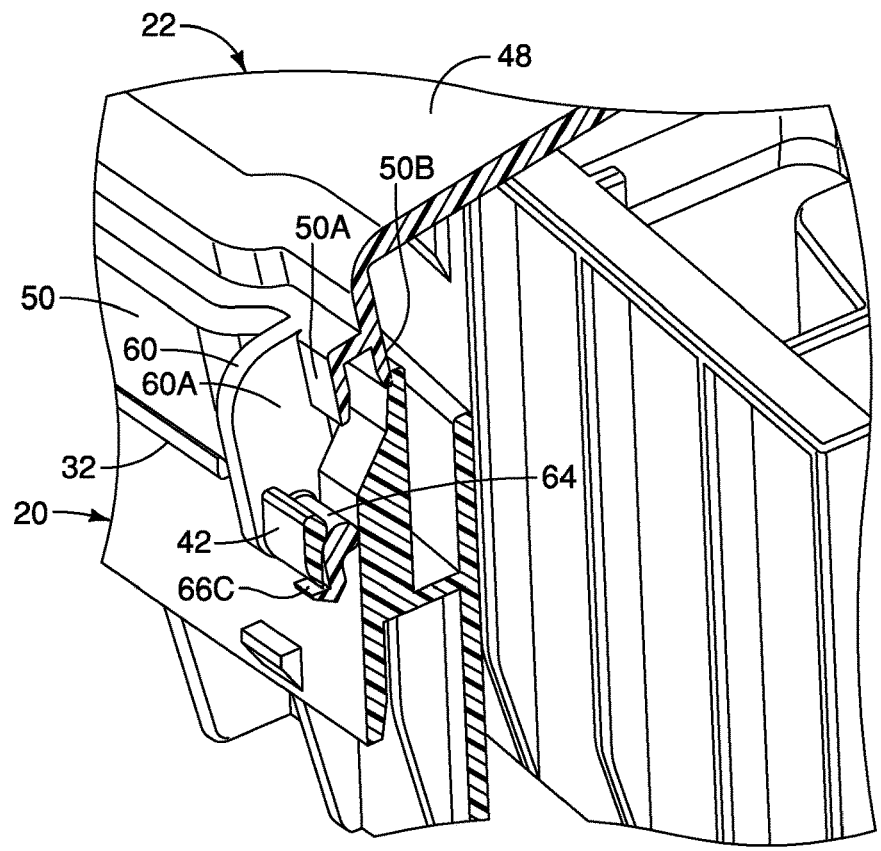
FIG. 8 is a perspective view in cross section of the fuse box assembly of FIG. 7.
Figure 9:
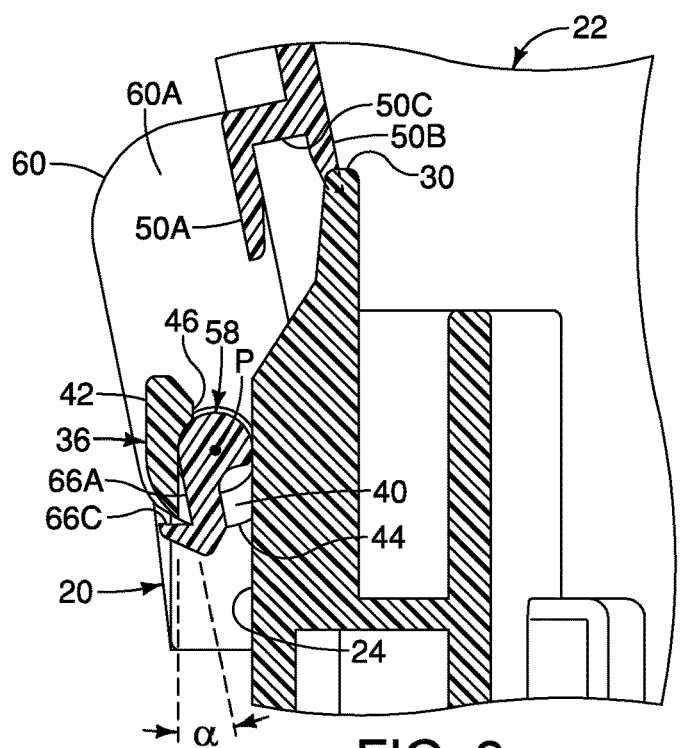
FIG. 9 is a side elevational view in cross section of the fuse box assembly of FIG. 7.

As shown in FIGS. 7-9, the cover 22 is rotated about an angle α of approximately ten degrees. In this position, the second portion 66B of the locking hook 66 is disposed beneath the upwardly extending tab 42, thereby preventing removal of the cover 22 from the base 20. The protrusion 46 further prevents upward movement of the cover 22 relative to the base 18. The cover 22 is rotated to a position in which the upper end 30 of the lower wall is not received by the recess 50C between the outer wall 50A and the inner wall 50B. The inner wall 50B extends downwardly a shorter distance than the outer wall 50A such that the rotational movement of the cover 22 in the counter-clockwise direction allows the inner wall 50B to pass over the upper end 30 of the lower wall 30 of the base 20, as shown in FIGS. 8 and 9.

Figure 10:
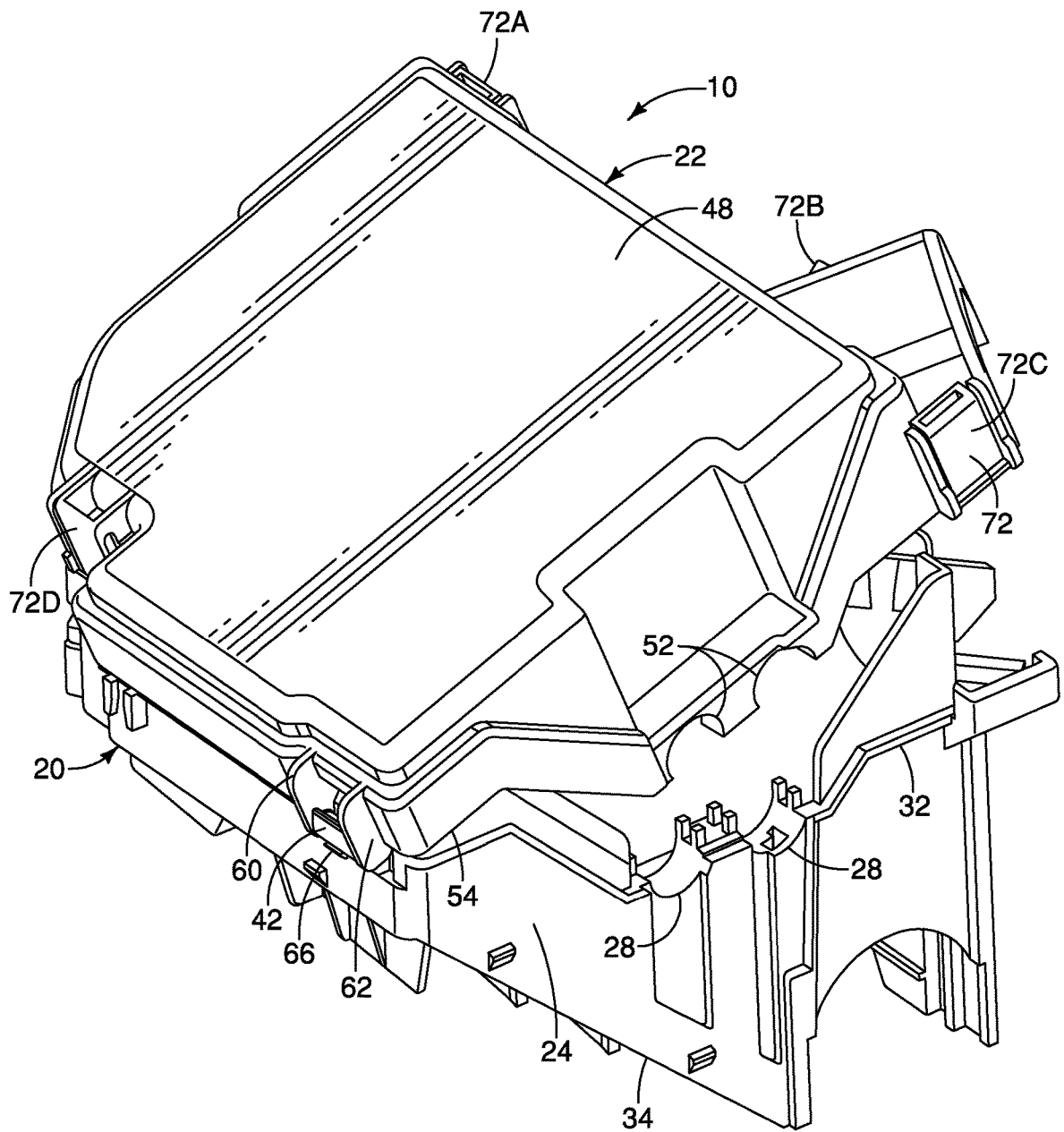
FIG. 10 is a perspective view of a fuse box assembly of FIG. 1 in which the fuse box cover is rotated approximately twenty degrees from the closed position.
Figure 11:
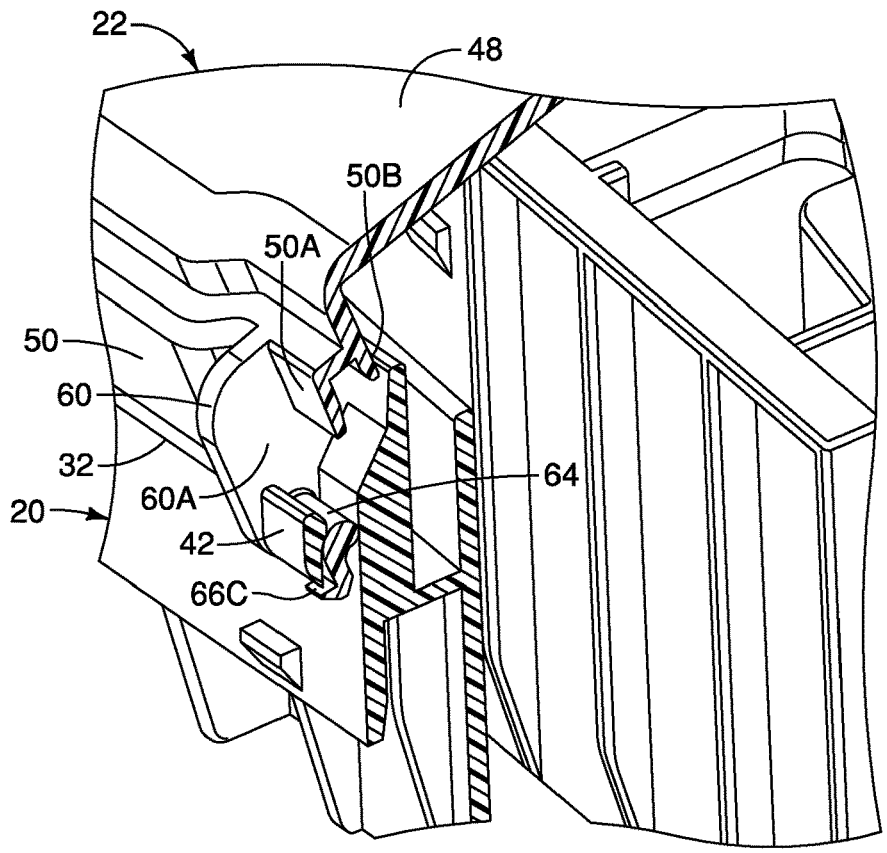
FIG. 11 is a perspective view in cross section of the fuse box assembly of FIG. 10.
Figure 12:
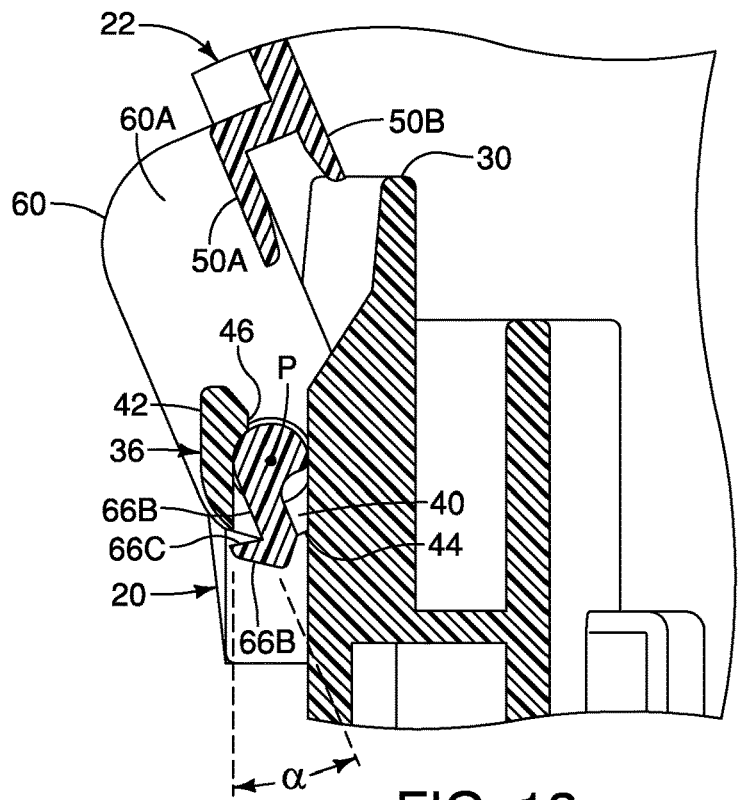
FIG. 12 is a side elevational view in cross section of the fuse box assembly of FIG. 10.

As shown in FIGS. 10-12, the cover 22 is rotated about an angle α of approximately twenty degrees. In this position, the second portion 66B of the locking hook 66 is disposed beneath the upwardly extending tab 42, thereby preventing removal of the cover 22 from the base 20. The protrusion 46 further prevents upward movement of the cover 22 relative to the base 18.

Figure 13:
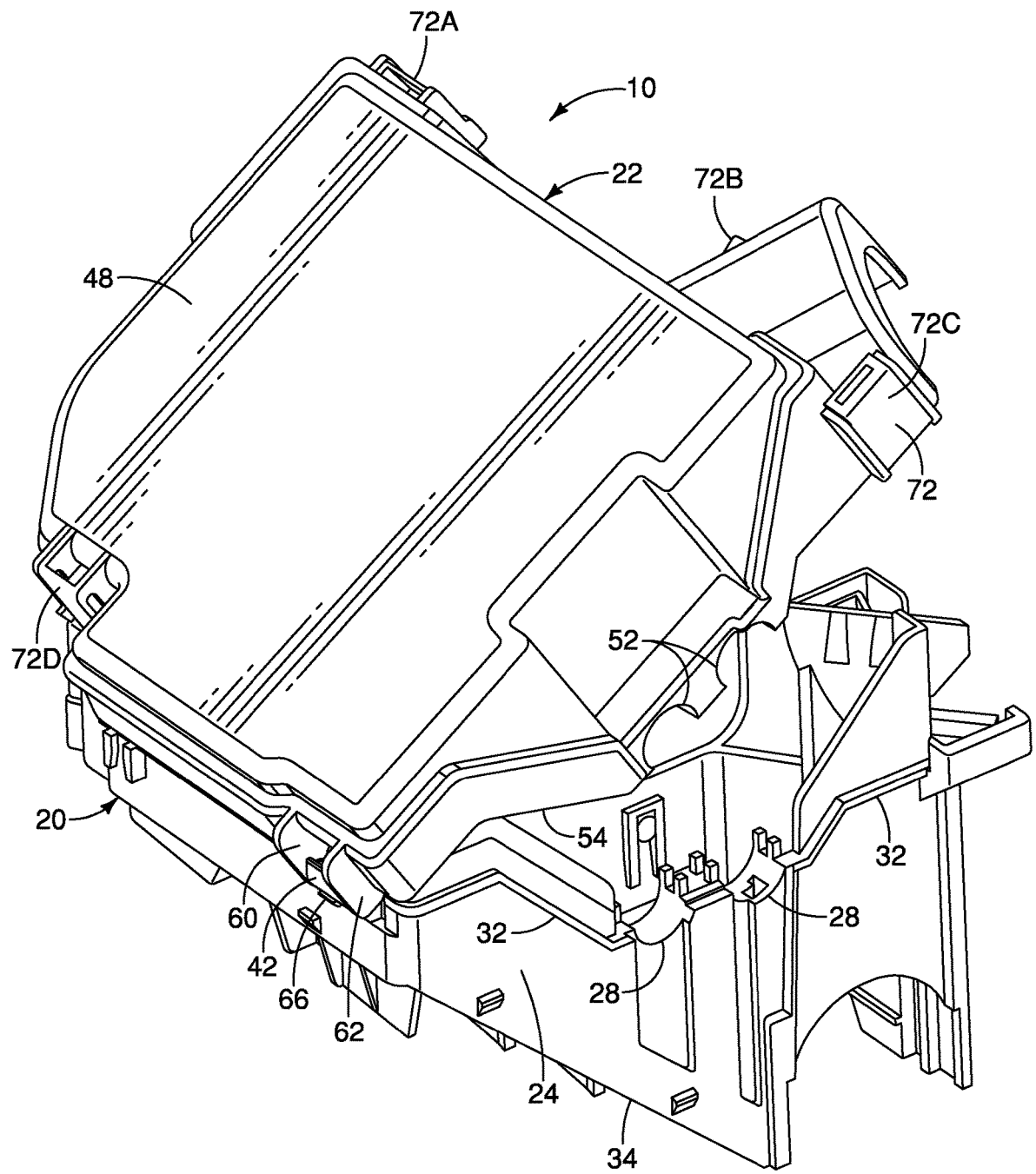
FIG. 13 is a perspective view of a fuse box assembly of FIG. 1 in which the fuse box cover is rotated approximately thirty-two degrees from the closed position.
Figure 14:
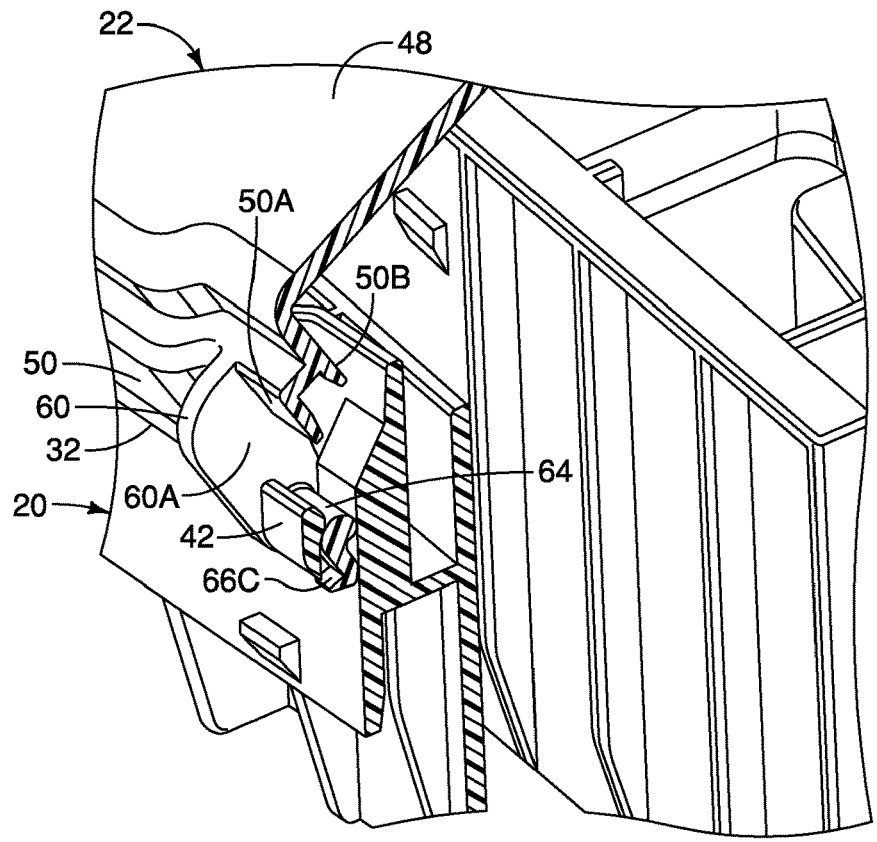
FIG. 14 is a perspective view in cross section of the fuse box assembly of FIG. 13.
Figure 15:
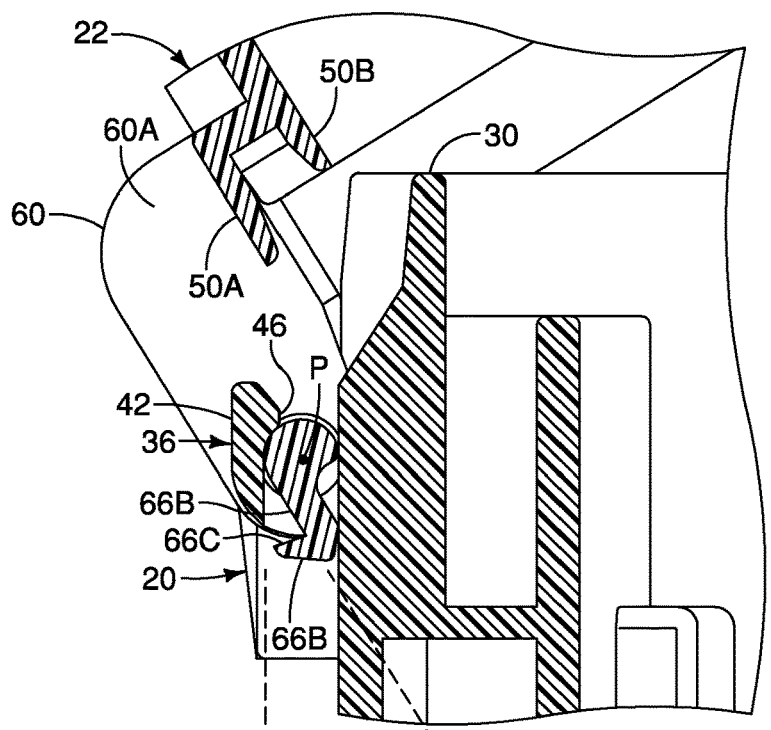
FIG. 15 is a side elevational view in cross section of the fuse box assembly of FIG. 13.

As shown in FIGS. 13-15, the cover 22 is rotated about an angle α of approximately thirty-two degrees. In this position, the second portion 66B of the locking hook 66 is not disposed beneath the upwardly extending tab 42, such that removal of the cover 22 from the base 20 is no longer prevented. Rotating the cover 22 approximately thirty-two degrees allows the locking member 58 to be disengaged from the projection opening 44. The upper surface 66C of the second portion 66B of the locking hook 66 is not directly disposed beneath the upwardly extending tab 42, such that upward movement of the cover 22 draws the second portion 66B of the locking hook 66 up through the opening 44 in the projection 36. The upwardly extending tab 42 of the projection 36 is resiliently connected to the lower wall 24 of the base 20 such that upward movement of the cover 22 relative to the base 18 results in the locking post 64 causing the protrusion 46 to flex away from the base 20, thereby allowing the cover 22 to be removed from the base 20 as shown in FIGS. 16-18. With the cover 22 removed from the base 20, the interior compartment 18 of the fuse box 10 is accessible.

Positioning the cover 22 at an angle of approximately thirty-two degrees relative to the base 20, as shown in FIGS. 16-18, allows the cover 22 to be reconnected to the base 20. The cover 22 is pushed downwardly and rotated clockwise once the second portion 66B of the locking hook 66 passes through the opening 44 in the projection 36, thereby disposing the upper surface 66C beneath the upwardly extending tab 42. The downward force exerted on the cover also reengages each of the plurality of locking tabs 72A-72D with the corresponding cover receiving openings 68A-68D.

General Interpretation of Terms

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts. Also as used herein to describe the above embodiment(s), the following directional terms "forward", "rearward", "above", "downward", "vertical", "horizontal", "below" and "transverse" as well as any other similar directional terms refer to those directions of a vehicle equipped with the locking assembly for a vehicle fuse box. Accordingly, these terms, as utilized to describe the present invention should be interpreted relative to a vehicle equipped with the locking assembly for a fuse box.

The term "configured" as used herein to describe a component, section or part of a device includes hardware and/or software that is constructed and/or programmed to carry out the desired function.

The terms of degree such as "substantially", "about" and "approximately" as used herein mean a reasonable amount of deviation of the modified term such that the end result is not significantly changed.

While only selected embodiments have been chosen to illustrate the present invention, it will be apparent to those skilled in the art from this disclosure that various changes and modifications can be made herein without departing from the scope of the invention as defined in the appended claims. For example, the size, shape, location or orientation of the various components can be changed as needed and/or desired. Components that are shown directly connected or contacting each other can have intermediate structures disposed between them. The functions of one element can be performed by two, and vice versa. The structures and functions of one embodiment can be adopted in another embodiment. It is not necessary for all advantages to be present in a particular embodiment at the same time. Every feature which is unique from the prior art, alone or in combination with other features, also should be considered a separate description of further inventions by the applicant, including the structural and/or functional concepts embodied by such feature(s). Thus, the foregoing descriptions of the embodiments according to the present invention are provided for illustration only, and not for the purpose of limiting the invention as defined by the appended claims and their equivalents.

What is claimed is:

1. A locking assembly for a fuse box of a vehicle comprising:
   a base, the base including a projection extending outwardly from a wall of the base, an opening being disposed in the projection, the opening being defined by a tab of the projection and the wall of the base, the projection being resiliently connected to the base; and
   a cover configured to be removably connected to the base, the cover including a locking member configured to be received by the opening in the projection when the cover is connected to the base,
   the cover being configured to rotate about a pivot axis passing through the locking member to disengage the locking member from the opening in the projection to remove the cover from the base, the pivot axis being spaced from and extending between the wall of the base and the tab of the projection when the cover is connected to the base when viewed in a direction parallel to the pivot axis.

2. The locking assembly according to claim 1, wherein the cover is rotated approximately thirty-two degrees to disengage the locking member from the projection opening.

3. The locking assembly according to claim 1, wherein the locking member includes first and second tabs extending outwardly from the cover.

4. The locking assembly according to claim 3, wherein the locking member includes a post extending between the first and second tabs, the pivot axis passing through the post.

5. The locking assembly according to claim 4, wherein the locking member includes a hook extending from the post, the hook engaging the projection when the cover is connected to the base.

6. The locking assembly according to claim 5, wherein the hook is rigidly connected to the post.

7. The locking assembly according to claim 4, wherein a protrusion protrudes inwardly from the projection toward the base to define a gap between the protrusion and an outer surface of the base.

8. The locking assembly according to claim 7, wherein a length of the gap is smaller than a width of the post.

9. The locking assembly according to claim 1, wherein the locking member is unitarily formed with the cover as a single member.

10. A fuse box assembly for a vehicle comprising:
    a fuse box base;
    a fuse box cover movably connected to the fuse box base between a first position and a second position, the fuse box cover being connected to the fuse box base in the first position and removable from the fuse box base in the second position;
    a projection extending outwardly from a wall of the fuse box base, an opening being disposed in the projection, the opening being defined by a tab of the projection and the wall of the base, a protrusion protruding inwardly from the projection toward the fuse box base to define a gap between the protrusion and an outer surface of the fuse box base; and
    a locking member received by the opening in the projection when the fuse box cover is in the first position and the locking member being removable from the opening in the projection when the fuse box cover is in the second position,
    the fuse box cover being configured to rotate about a pivot axis passing through the locking member to move between the first and second positions, the pivot axis being spaced from and extending between the wall of the base and the tab of the projection when the cover is connected to the base when viewed in a direction parallel to the pivot axis.

11. The fuse box assembly according to claim 10, wherein a plurality of locking tabs extending from the fuse box cover are configured to be received by a plurality of openings disposed in the fuse box base, each locking tab being received by a different opening to further secure the fuse box cover to the fuse box base.

12. The fuse box assembly according to claim 11, wherein each of the fuse box locking tabs is disengaged from the corresponding fuse box base opening prior to rotating the fuse box cover from the first position to the second position.

13. The fuse box assembly according to claim 10, wherein the fuse box cover is rotated approximately thirty-two degrees between the first and second positions.

14. The fuse box assembly according to claim 10, wherein the locking member includes a post extending between first and second tabs extending outwardly from the fuse box cover, the pivot axis passing through the post.

15. The fuse box assembly according to claim 14, wherein the locking member includes a hook extending from the post, the hook engaging the projection when the cover is connected to the base.

16. The fuse box assembly according to claim 15, wherein the hook is rigidly connected to the post.

17. The fuse box assembly according to claim 10, wherein a length of the gap is smaller than a width of the post.

18. The fuse box assembly according to claim 10, wherein the locking member is unitarily formed with the fuse box cover as a single member.

19. A locking assembly for a fuse box of a vehicle comprising:
   a base, the base including a projection extending outwardly from a wall of the base, an opening being disposed in the projection, the opening being defined by a tab of the projection and the wall of the base; and
   a cover configured to be removably connected to the base, the cover including a locking member configured to be received by the opening in the projection when the cover is connected to the base,
   the cover being configured to rotate about a pivot axis passing through the locking member to disengage the locking member from the opening in the projection to remove the cover from the base, the pivot axis being spaced from and extending between the wall of the base and the tab of the projection when the cover is connected to the base when viewed in a direction parallel to the pivot axis,
   the locking member including first and second tabs extending outwardly from the cover and a post extending between the first and second tabs, the pivot axis passing through the post, and
   the locking member including a hook extending from the post, the hook engaging the projection when the cover is connected to the base.

* * * * *